United States Patent
Jung et al.

(10) Patent No.: US 7,396,777 B2
(45) Date of Patent: Jul. 8, 2008

(54) METHOD OF FABRICATING HIGH-K DIELECTRIC LAYER HAVING REDUCED IMPURITY

(75) Inventors: Hyung-Suk Jung, Suwon-si (KR); Jong-Ho Lee, Suwon-si (KR); Ha-Jin Lim, Goyang-si (KR); Jae-Eun Park, Yonggin-si (KR); Yun-Seok Kim, Seoul (KR); Jong-Ho Yang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 376 days.

(21) Appl. No.: 11/107,559

(22) Filed: Apr. 15, 2005

(65) Prior Publication Data

US 2005/0233598 A1    Oct. 20, 2005

(30) Foreign Application Priority Data

Apr. 19, 2004   (KR) .................... 10-2004-0026690

(51) Int. Cl.
*H01L 21/31*     (2006.01)
*H01L 21/469*    (2006.01)

(52) U.S. Cl. ............... 438/778; 257/635; 257/E29.042; 257/E21.639; 438/785

(58) Field of Classification Search ........... 438/778, 438/785, 786; 257/635, E21.639, E29.042
See application file for complete search history.

(56) References Cited

U.S. PATENT DOCUMENTS

| 6,020,243 | A | 2/2000 | Wallace et al. |
| 6,291,283 | B1 | 9/2001 | Wilk |
| 6,348,386 | B1 | 2/2002 | Gilmer ................... 438/288 |
| 6,407,435 | B1 | 6/2002 | Ma et al. |
| 6,420,279 | B1 * | 7/2002 | Ono et al. ................ 438/785 |
| 6,627,503 | B2 | 9/2003 | Ma et al. ................. 438/287 |
| 2005/0106798 | A1 * | 5/2005 | Lee et al. ................ 438/197 |

FOREIGN PATENT DOCUMENTS

| KR | 01-28417 | 4/2001 |
| KR | 02-01337 | 1/2002 |
| KR | 10-2005-0062132 | 6/2005 |

* cited by examiner

*Primary Examiner*—Caridad Everhart
(74) *Attorney, Agent, or Firm*—Mills & Onello LLP

(57) ABSTRACT

Methods of fabricating high-k dielectric layers having reduced impurities for use in semiconductor applications are disclosed. The methods include the steps of: forming a stacked dielectric layer having a first dielectric layer and a second dielectric layer formed on a semiconductor substrate using an ALD method, in combination with a post-treatment step performed to the stacked dielectric layer. The steps of forming the stacked dielectric layer and performing the post-treatment are repeated at least once, thereby fabricating the high-k dielectric layer.

32 Claims, 8 Drawing Sheets

METHOD OF FABRICATING HIGH-K DIELECTRIC LAYER HAVING REDUCED IMPURITY

CROSS-REFERENCE TO RELATED APPLICATION

This application claims the benefit of Korean Patent Application No. 2004-26690, filed Apr. 19, 2004, the contents of which are hereby incorporated herein by reference in their entirety.

BACKGROUND OF THE INVENTION

1. Field of the Invention

The present invention relates to methods of fabricating a dielectric layer used in a semiconductor device and, more particularly, to methods of fabricating a high-k dielectric layer having reduced impurities.

2. Description of the Related Art

In a semiconductor device, a dielectric layer has a variety of uses. Typically, the dielectric layer is used as a gate dielectric layer of a MOS field effect transistor. To normally operate the semiconductor device, the gate dielectric layer should be able to maintain the capacitance (C) of the device at a suitable level. The capacitance of the dielectric layer is defined as follows: $C = \epsilon \cdot A/d$ (where C is capacitance, $\epsilon$ is a dielectric constant, A is a surface area of the dielectric layer, and d is the thickness of the dielectric layer). That is, the capacitance of the dielectric layer is directly proportional to the dielectric constant and the surface area of the dielectric layer and is inversely proportional to the thickness of the dielectric layer. As semiconductor devices have become more highly integrated, the area of a unit cell of the semiconductor device has been reduced and therefore the surface area of the gate dielectric layer has also been reduced. Hence, there is a need to compensate for the associated reduction of the capacitance of the dielectric layer due to the reduced surface area of the gate dielectric layer. The reduced capacitance of the dielectric layer may be compensated for by decreasing the thickness (d) of the dielectric layer and/or by using a higher-k dielectric material. In cases where the thickness of the dielectric layer is reduced, however, there often occurs a problem in that leakage current is increased due to the reduced thickness of the dielectric layer. Accordingly, in order to maintain the proper capacitance of the dielectric layer without increasing the leakage current, a dielectric material having a higher-k dielectric constant is required.

High-k dielectric materials applicable to the gate dielectric layer of a semiconductor device conventionally include an aluminum oxide ($Al_2O_3$) layer, a hafnium oxide ($HfO_2$) layer, a zirconium oxide ($ZrO_2$) layer, a tantalum oxide ($Ta_2O_5$) layer, a titanium oxide ($TiO_2$) layer, etc. Further, dielectric materials having an ultra-high k dielectric constant are known including a barium strontium titanate (BST) layer, a lead zirconate titanate (PZT) layer, etc. However, the application of a new dielectric material should be determined in conjunction with the related considerations of compatibility, reliability, productivity, etc. with a fabricating process of the conventional semiconductor device as well as a high-k dielectric constant.

From this point of view, when one of the foregoing high-k dielectric materials is used as the gate dielectric layer, one or more of the following problems may occur. In the case of the BST layer, the titanium oxide layer, the tantalum oxide layer, etc., reactivity with a silicon substrate is relatively high; and, thus, the interfacial properties between the gate dielectric layer and the silicon substrate become poor, thereby increasing the leakage current or deteriorating carrier mobility. In the case of the aluminum oxide layer, thermal stability is relatively high but the dielectric constant is relatively low, so that the resulting improvement in capacitance is limited. Further, the aluminum oxide layer has a negative fixed charge, so that it is difficult to control a threshold voltage. In the case of the hafnium oxide layer, the zirconium oxide layer, etc., these dielectric layers are known to become partially crystallized by the heat (annealing) treatment step that typically follows formation of the dielectric layer, thereby increasing the leakage current.

In the meanwhile, a hafnium silicate ($HfSiO_2$) layer has been developed as a promising material for the gate dielectric layer. The hafnium silicate layer has good properties as the gate dielectric layer. For example, the NMOS threshold voltage and the current performance of hafnium silicate layers are equivalent to those of a silicon oxynitride (SiON) layer. The hafnium silicate layer may be formed by a metal-organo chemical vapor deposition (MOCVD) method or an atomic layer deposition (ALD) method. In the case of the MOCVD method, it is difficult to control the thickness and the composition of the hafnium silicate layer. On the other hand, in the case of the ALD method, the hafnium silicate layer is formed as a sequence of atomic layers, so that it is possible to precisely control the thickness of the completed hafnium silicate layer. The ALD method is typically performed at a relatively low temperature. For reference, there has also been disclosed a method of forming the hafnium silicate layer by forming a nano-laminated structure on which a hafnium oxide layer and a silicon oxide layer are alternately stacked using the ALD method, in U.S. Pat. No. 6,627,503, entitled "Multilayer dielectric stack," which patent is incorporated herein by reference.

However, because the ALD method is performed at a relatively low temperature, impurities such as carbon (C), chlorine (Cl), etc. injected from source gas(es) may remain in the hafnium silicate layer after formation, thereby contaminating the hafnium silicate layer and impairing the performance of the resulting semiconductor device. Accordingly, there is a need for an alternative technique for preparing a high-quality, high-k dielectric layer of controlled thickness while substantially eliminating contamination by impurities.

SUMMARY OF THE INVENTION

Embodiments of the present invention generally provide methods of fabricating a high-k dielectric layer for semiconductor applications having a laminate structure using an ALD method, in which impurity content is minimized.

In one aspect, the invention is directed to methods of fabricating a high-k dielectric layer having reduced impurities. A method in accordance with this invention may include forming a stacked dielectric layer having a first dielectric layer and a second dielectric layer formed on a semiconductor substrate, the first dielectric layer and the second dielectric layer each being formed using an ALD method. One or more post-treatment steps may be performed on the stacked dielectric layer. The process steps of forming the stacked dielectric layer and performing the post-treatment are completed and then repeated at least once in order to fabricate the high-k dielectric layer according to this invention.

The method of this invention may further include the step of forming a third dielectric layer on the second dielectric layer after performing the post-treatment step to the stacked dielectric layer, wherein the third dielectric layer is formed of the same material as the first dielectric layer.

In some embodiments, the first dielectric layer may be formed of a metal dielectric layer, and the second dielectric layer may be formed of a silicon oxide layer ($SiO_2$) or a silicon oxynitride (SiON) layer. Alternatively, the first dielectric layer may be formed of the silicon oxide layer or the silicon oxynitride layer, and the second dielectric layer may be formed of the metal dielectric layer. The metal dielectric layer may be formed of a metal oxide layer or a metal oxynitride layer. As used herein, the term "metal dielectric layer" will be understood to include either a metal oxide layer or a metal oxynitride layer. Preferably, the metal oxide layer may be formed of a hafnium oxide layer ($HfO_2$) or a zirconium oxide layer ($ZrO_2$), and the metal oxynitride layer may be formed of a hafnium oxynitride layer (HfON) or a zirconium oxynitride layer (ZrON). According to other embodiments of the invention, the high-k dielectric layer may be formed of a metal silicate layer, wherein the metal silicate layer may have a laminated structure wherein the metal dielectric layer and the silicon oxide layer are alternately stacked, or wherein the metal dielectric layer and the silicon oxynitride layer are alternately stacked.

In some invention embodiments, the post-treatment step(s) may be performed to the first dielectric layer before forming the second dielectric layer, and then repeated following formation of the second dielectric layer.

In some invention embodiments, the post-treatment to the stacked dielectric layer, or to the first dielectric layer, is performed in order to remove impurities in the stacked dielectric layer or the first dielectric layer. Therefore, the post-treatment to the first dielectric layer may be omitted in consideration of the whole thickness of the stacked dielectric layer when the impurities in the first dielectric layer and in the second dielectric layer may be effectively removed through the post-treatment of the stacked dielectric layer.

In some invention embodiments, the post-treatment to the stacked dielectric layer or the first dielectric layer is performed by an oxidation treatment, nitridation treatment, heat-treatment in a substantially inert atmosphere, heat-treatment in a vacuum atmosphere, heat-treatment in a hydrogen atmosphere, plasma-treatment in a hydrogen atmosphere, or by a combination of two or more of these post-treatment steps carried out simultaneously or in any suitable order.

BRIEF DESCRIPTION OF THE DRAWINGS

The foregoing and other objects, features and advantages of the invention will be apparent from the more particular description of preferred embodiments of the invention, as described below and as illustrated in the accompanying drawings. The drawings are not necessarily to scale, emphasis instead being placed upon illustrating the principles of the invention. In the drawings.

DETAILED DESCRIPTION OF THE INVENTION

Figure 1:
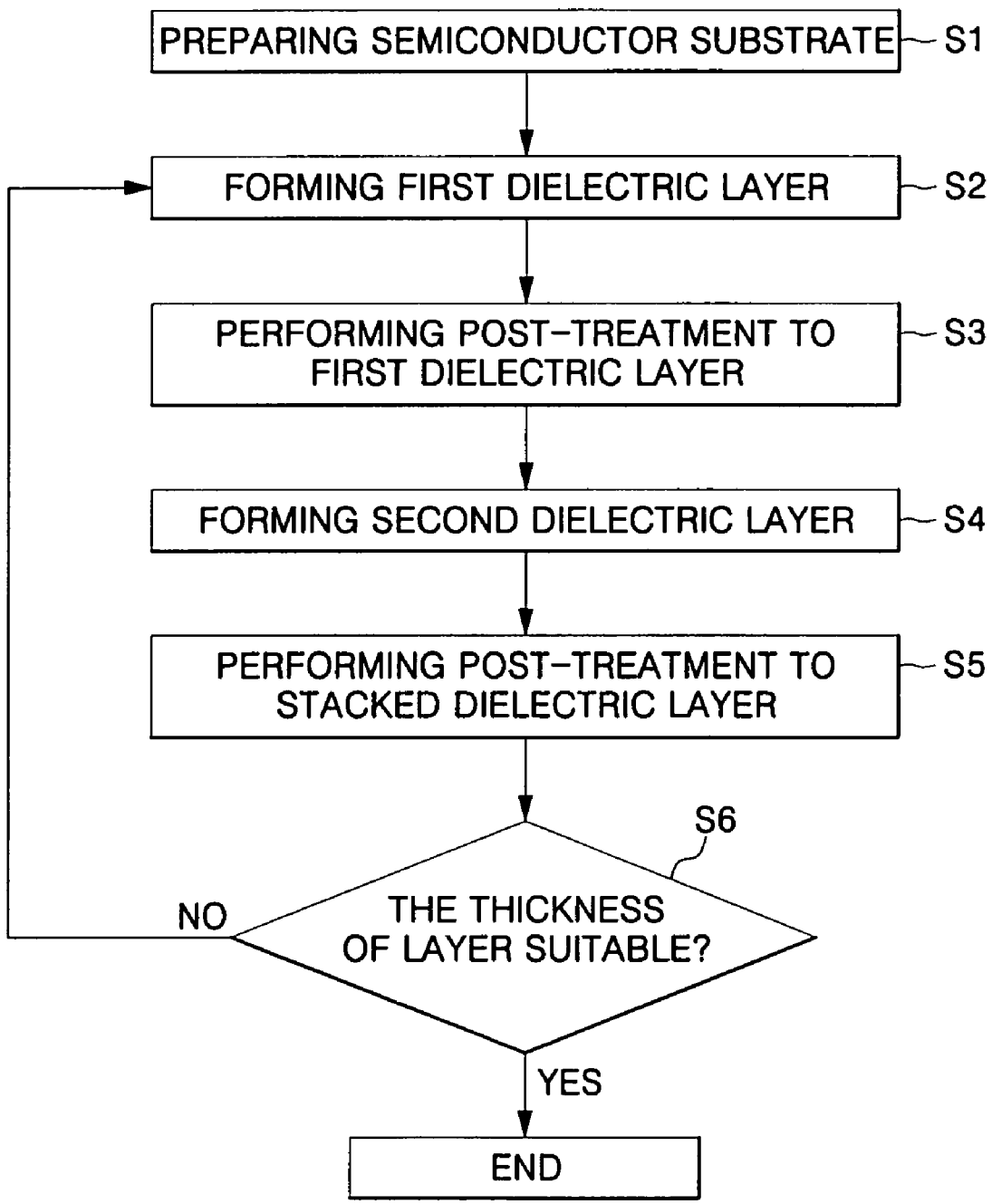
FIG. 1 is a representative process flow chart illustrating methods of fabricating a gate dielectric layer according to embodiments of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like reference numbers refer to like elements throughout the specification and the drawings.

FIG. 1 is a representative flow chart illustrating methods of fabricating a gate dielectric layer according to embodiments of the present invention, and FIGS. 2 to 5 are schematic cross-sectional views illustrating fabrication of a gate dielectric layer according to embodiments of the present invention using a sequence of process steps as shown in FIG. 1.

Figure 2:
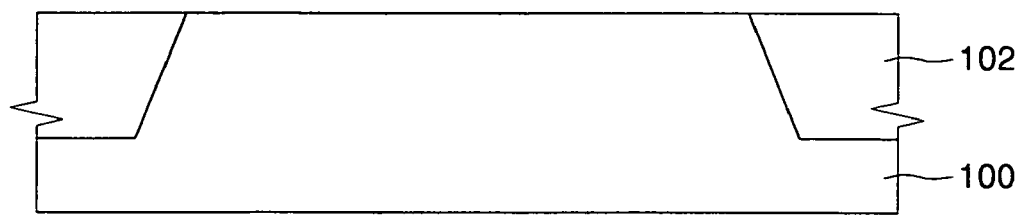
FIGS. 2 to 5 are schematic cross-sectional views illustrating methods of fabricating a gate dielectric layer according to embodiments of the present invention.

Referring to FIGS. 1 and 2, a semiconductor substrate 100 is provided (step S1). As shown in FIG. 2, an isolation layer 102 defining an active region may be previously formed in the semiconductor substrate 100 prior to the gate dielectric layer formation of the present invention. The isolation layer 102 may be formed by a well-known shallow trench isolation (STI) process or in any other suitable way.

Figure 3:
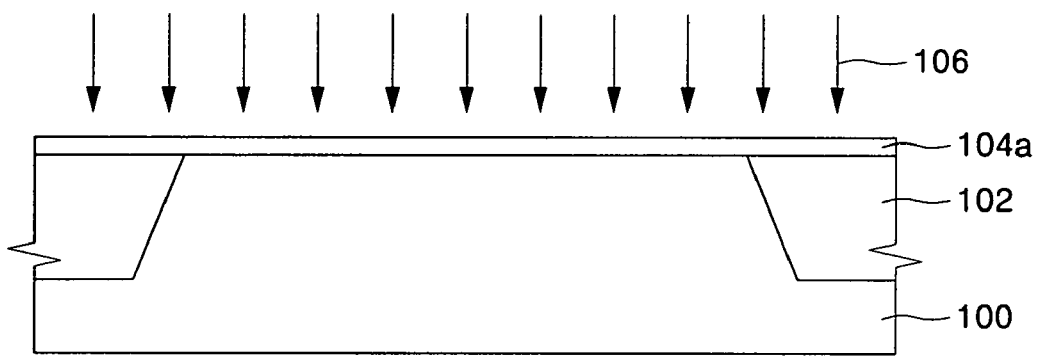

Referring to FIGS. 1 and 3, a first dielectric layer 104a is formed on the semiconductor substrate 100 (step S2). The first dielectric layer 104a may be formed of a metal dielectric layer, a silicon oxide layer, or a silicon oxynitride layer. Hereinafter, the step of forming the first dielectric layer 104a of a metal dielectric layer will be described as an example. The metal dielectric layer may be formed of a metal oxide layer or a metal oxynitride layer. The metal oxide layer may be formed of a hafnium oxide layer or a zirconium oxide layer. The metal oxynitride layer may be formed of a hafnium oxynitride layer or a zirconium oxynitride layer. In some embodiments of the present invention, the metal oxide layer is preferably formed of a hafnium oxide layer. Further, the first dielectric layer 104a is formed by an atomic layer deposition (ALD) method. Here, the ALD method forms a thin film as an atomic layer by the sequential steps of chemisorption, followed by surface reaction between reactants, and then followed by desorption of a byproduct. In the ALD method, it is possible to very precisely control the thickness of the thin film because the thin film is deposited as an atomic layer, or as a series of atomic layers, and the thin film may be formed at a relatively low temperature. Hereinafter, a process of forming a hafnium oxide layer using the ALD method will be described.

First, the semiconductor substrate 100 is suitably prepared and loaded into a reaction chamber. Then, hafnium source gas is injected into the reaction chamber loaded with the semiconductor substrate 100 for a first period of time under suitable temperature and pressure conditions. Here, the hafnium source gas may preferably be selected from the group consisting of $HfCl_4$, TEMAH (tetra-ethyl-methyl amino hafnium), Hf (MMP) 4(tetra(1-methoxy2-methyl2-propoxy) Hf), and mixtures thereof, but other hafnium source gases may also be utilized in this step. As the hafnium source gas is injected into the reaction chamber, a chemisorption layer of the hafnium source gas is formed on the suitably prepared surface of the semiconductor substrate 100. Then, the residual hafnium source gas is discharged from the reaction chamber for a second period of time. To more effectively discharge the residual hafnium source gas from the reaction chamber, purge gas may be injected into the reaction chamber during this purging period, wherein the purge gas may include a substantially inert gas such as argon (Ar) gas or similar inert gases.

After discharging the residual hafnium source gas from the reaction chamber, oxidation gas is injected into the reaction chamber for a third period of time. Here, the oxidation gas may be selected from the group consisting of $H_2O$, $H_2O_2$, $O_3$, $O_2$, and $N_2O$ and mixtures thereof. Further, in some embodiments, the oxidation gas may be activated by a plasma treatment prior to or during injection into the reaction chamber. The oxidation gas reacts in the chamber with the chemisorption layer of the hafnium source gas under suitable temperature and pressure conditions. As a result, an atomic layer of hafnium oxide is formed on the semiconductor substrate 100. Then, the residual oxidation gas is discharged from the reaction chamber for a fourth period of time. To more effectively discharge the residual oxidation gas from the reaction chamber during this second purging period, a substantially inert gas such as argon (Ar) gas or the like may be injected into the reaction chamber.

The first through fourth time periods, as described above, during which each of the hafnium source gas and the oxidation gas is alternately injected into and thereafter discharged from the reaction chamber, when taken together are regarded as one deposition or layer formation cycle. By repeating this cycle multiple times, the hafnium oxide layer with a desired predetermined thickness is thereby formed.

It has been found that the metal dielectric layer 104a may become at least partially crystallized when its thickness is increased. In particular, when the hafnium oxide layer or the zirconium oxide layer reaches a critical thickness or greater, leakage current may occur due to this crystallization phenomenon. Therefore, the metal dielectric layer 104a is preferably formed to have a thickness of about 30 Å or less in consideration of the crystallization limitation.

After forming the first dielectric layer 104a, a post-treatment 106 step (represented by the arrows in FIG. 3) may be applied to the first dielectric layer 104a (step S3). Hereinafter, the post-treatment 106 for the first dielectric layer 104a will be called a first post-treatment 106. The first post-treatment 106 is performed to remove impurities such as carbon, chlorine, etc. that may remain in the first dielectric layer 104a following formation by the ALD method as described above. The first post-treatment 106 may comprise an oxidation treatment, a nitridation treatment, a heat-treatment in a substantially inert atmosphere, a heat-treatment in a vacuum atmosphere, a heat-treatment in a hydrogen atmosphere, a plasma-treatment in a hydrogen atmosphere, or a combination of two of more of such treatments carried out simultaneously or in any suitable order.

Figure 4:
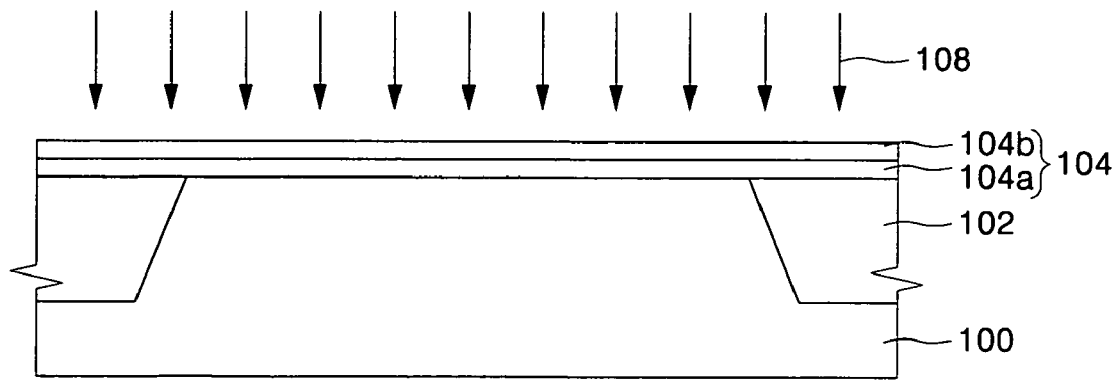

Referring to FIGS. 1 and 4, a second dielectric layer 104b is formed on the first dielectric layer 104 (step S4). The second dielectric layer 104b may be formed of a metal dielectric layer, a silicon oxide layer or a silicon oxynitride layer. In the case where the first dielectric layer 104a is formed of the metal dielectric layer, the second dielectric layer 104b is formed of the silicon oxide layer or the silicon oxynitride layer. Oppositely, in the case where the first dielectric layer 104a is formed of the silicon oxide layer or the silicon oxynitride layer, the second dielectric layer 104b is formed of the metal dielectric layer. Hereinafter, a process will be described wherein the second dielectric layer 104b is formed of the silicon oxide layer as an example. The second dielectric layer 104b is formed by an ALD method. The second dielectric layer 104b may be formed to have a desired predetermined thickness by repeating one deposition cycle multiple times wherein, during each such cycle, each of the source gas and the oxidation gas is alternately injected into and thereafter discharged from the reaction chamber as described above. In embodiments of the present invention, when the second dielectric layer 104b is to be formed of the silicon oxide layer, the silicon source gas may preferably be selected from the group consisting of DCS (dichloro silane), TCS (trichlorosilane) or HCD (hexa chlorodisilane), and mixtures thereof, but other silicon source gases may also be utilized in this step. Further, the oxidation gas may be selected from the group consisting of $H_2O$, $H_2O_2$, $O_3$, $O_2$, and $N_2O$, and mixtures thereof. In some embodiments, the oxidation gas may be activated through a plasma-treatment prior to or during injection into the reaction chamber. The thickness of the second dielectric layer 104b is preferably determined in consideration of the thickness of the first dielectric layer 104a and the composition of the whole dielectric layer 104 (consisting of both layers 104a and 104b, as shown in FIG. 4). Preferably, the thickness of the second dielectric layer 104b is formed to have a thickness of about 30 Å or less.

As described above, the second dielectric layer 104b is formed on the first dielectric layer 104a, thereby forming a stacked dielectric layer 104. Here, the stacked dielectric layer 104 includes the first and second dielectric layers 104a and 104b stacked on the semiconductor substrate 100 in sequence. Then, post-treatment step 108 (represented by the arrows in FIG. 4) is applied to the stacked dielectric layer 104 (step S5). Hereinafter, the post-treatment 108 for the stacked dielectric layer 104 will be called a second post-treatment 108. The second post-treatment 108 is performed to remove impurities such as carbon, chlorine, etc. that may remain in the stacked dielectric layer 104 following formation by the ALD method as described above. Accordingly, when the impurities remaining in the stadked dielectric layer 104 may be effectively removed by only the second post-treatment 108, the first post-treatment 106 may be omitted. The second post-treatment 108 may comprise an oxidation treatment, a nitridation treatment, a heat-treatment in a substantially inert atmosphere, a heat-treatment in a vacuum atmosphere, a heat-treatment in a hydrogen atmosphere, a plasma-treatment in a hydrogen atmosphere, or a combination of two or more of such treatments carried out simultaneously or in any suitable order. The oxidation treatment may be performed, for example, through a dry oxidation treatment performed in a NO, $NO_2$, or $O_2$ atmosphere. The plasma-treatment may be performed in an $O_2$ atmosphere. The heat treatment may be performed in an $O_3$ atmosphere. The wet oxidation treatment may be performed in an $O_3$ atmosphere. Here, the wet oxidation treatment may be performed with $H_2O$, ISSG (in-situ steam generation) or WVG (water vapor generation). Further, the nitridation treatment may be performed through the nitrogen plasma treatment or the heat treatment in a nitrogen atmosphere. Here, the nitrogen plasma treatment may be performed using decoupled plasma, remote plasma or ammonia plasma. Further, the heat treatment in the nitrogen atmosphere may be performed in a $NH_3$, NO, or $N_2O$ atmosphere. Further, the heat treatment in the substantially inert atmosphere may be performed in an Ar, He, or $N_2$ atmosphere. The oxidation treatment, the nitridation treatment, and the heat treatment in the substantially inert atmosphere, as described above, may be equally applied as the first post-treatment 106.

Figure 5:
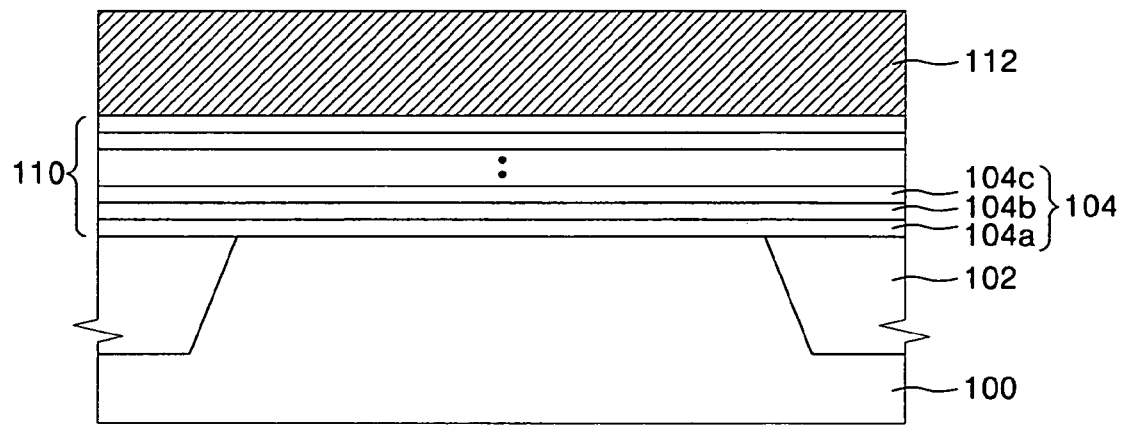

Referring to FIGS. 1 and 5, the deposition process for one deposition cycle, comprised of the foregoing sequence of process steps S2, S3, S4 and S5, is performed to form the stacked dielectric layer 104 on the semiconductor substrate 100. The foregoing sequence of process steps is then preferably repeated in sequence, thereby fabricating a completed gate dielectric layer 110 having a desired overall thickness (step S6). For example, when the first dielectric layer 104a and the second dielectric layer 104b are a hafnium oxide layer and a silicon oxide layer respectively, the gate dielectric layer 110 may advantageously be formed as a hafnium silicate layer. In some embodiments of the present invention, after performing the post-treatment 108 for the stacked dielectric layer 104, a third dielectric layer 104c may be additionally formed on the second dielectric layer 104b, as illustrated in FIG. 5. In this case, the third dielectric layer 104c is preferably formed of the same material as the first dielectric layer 104a for example by repeating process steps S2 and S3 of FIG. 1.

As described above, the completed gate dielectric layer 110 according to embodiments of the present invention has a laminated structure wherein a metal dielectric layer and a silicon oxide layer are alternately stacked, or wherein a metal dielectric layer and a silicon oxynitride layer are alternately stacked. As a result, a silicon oxide layer or a silicon oxynitride layer is interposed between the metal dielectric layers, thereby preventing leakage current from increasing due to the phenomenon of partial crystallization of the metal dielectric layer during subsequent treatment/fabrication steps. Further, post-treatment in accordance with this invention is performed to remove residual impurities that may remain in a dielectric layer following formation by an ALD method, thereby minimizing imperfections in and/or impaired performance of the gate dielectric layer due to the impurities.

Still Referring to FIG. 5, after forming the gate dielectric layer 110, a gate conductive layer 112, such as a poly silicon layer is formed on the gate dielectric layer 110. Thereafter, conventional processes for fabricating a transistor may be performed, such as a photolithography/anisotropical etching processes, an impurity ion implantation process, etc.

EXPERIMENTAL EXAMPLES

Figure 6A:
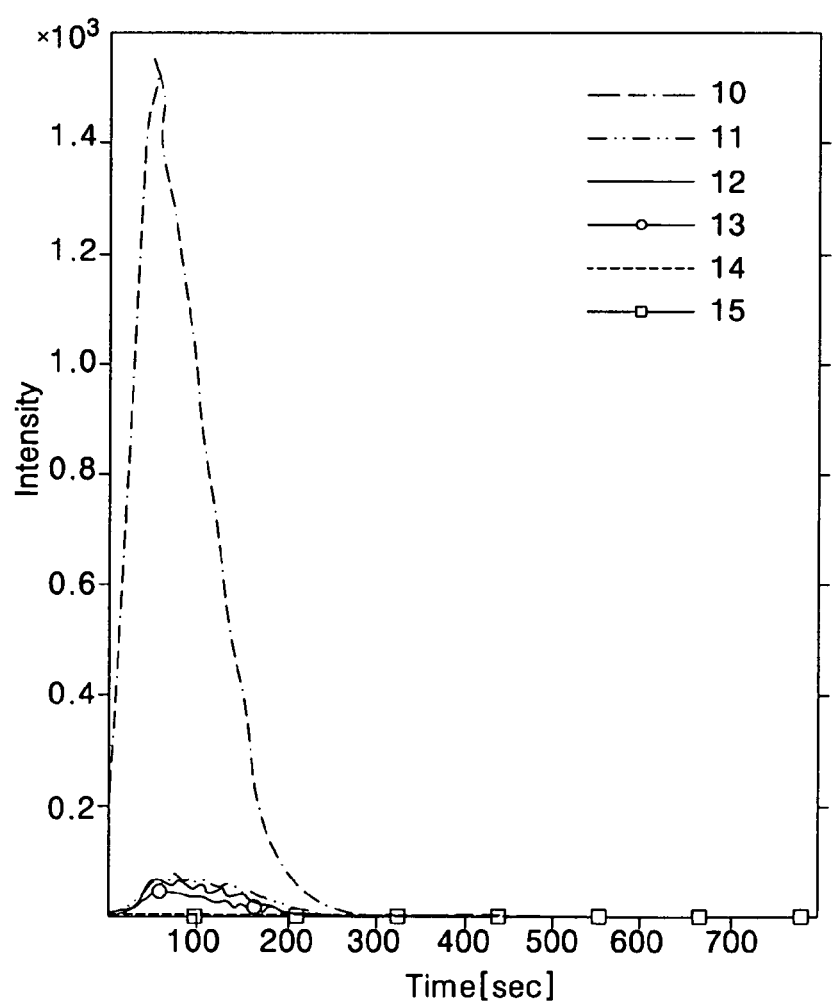
FIGS. 6A and 6B are secondary ion mass spectrometry (SIMS) graphs illustrating a change of impurity content in a dielectric layer over time according to post-treatment processing in accordance with this invention.
Figure 6B:
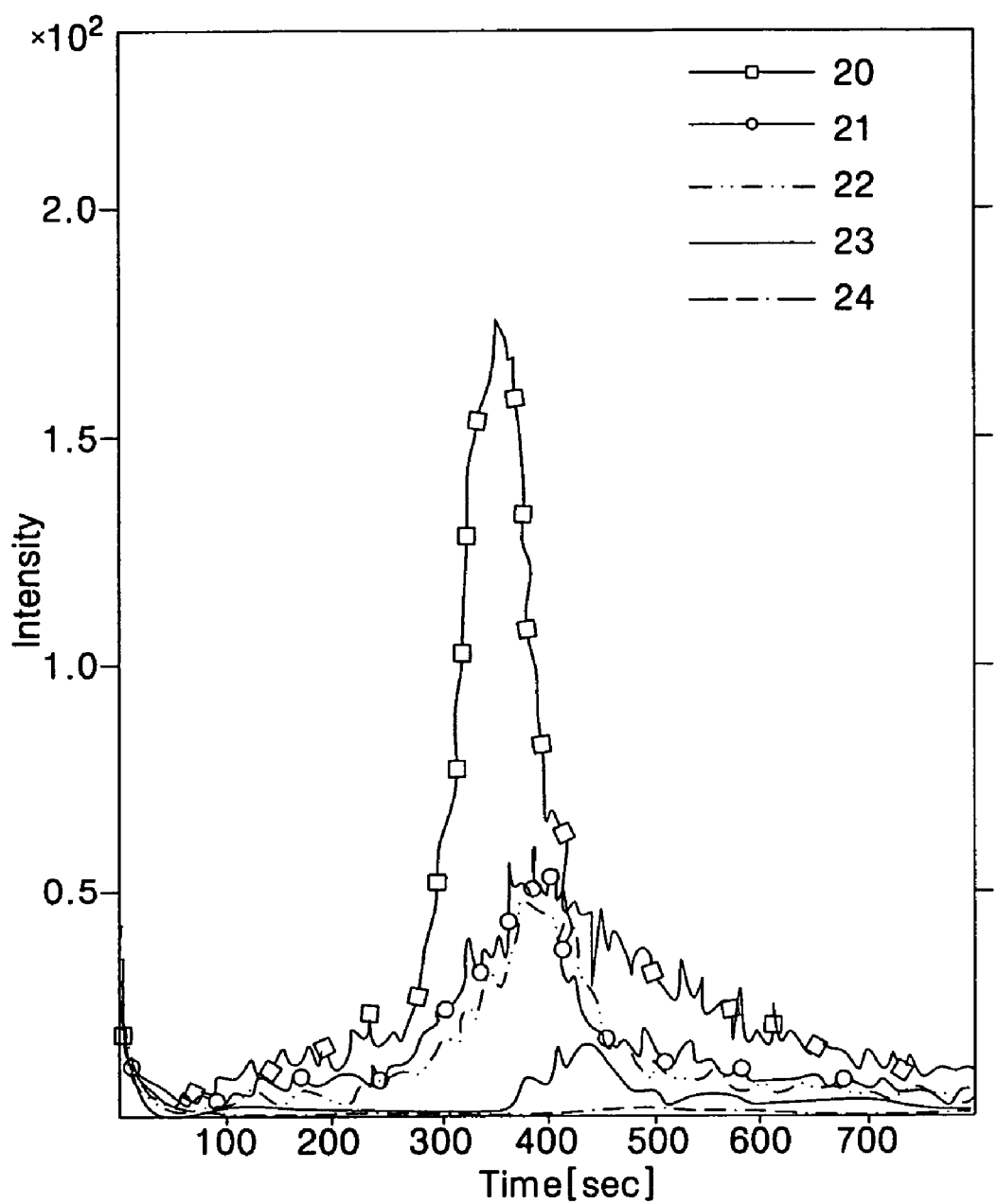

FIGS. 6A and 6B are secondary ion mass spectrometry (SIMS) graphs illustrating a change of impurity content in a dielectric layer over time during the course of a post-treatment step in accordance with this invention. FIG. 6A shows a change of chlorine content, and FIG. 6B shows a change of carbon content. In FIGS. 6A and 6B, the graphs are based on results of the post-treatment for samples under conditions of the following Table 1.

TABLE 1

| sample | Dielectric layer | Post-treatment |
| --- | --- | --- |
| First sample (10) | ALD SiO$_2$ | x |
| Second sample (11) | | 450° C., heat treatment in O$_3$ atmosphere |
| Third sample (12) | | 700° C., heat treatment in N$_2$ atmosphere |
| Fourth sample (13) | | 750° C., heat treatment in O$_2$ atmosphere |
| Fifth sample (14) | | 750° C., heat treatment in NH$_3$ atmosphere |
| Sixth sample (15) | | 750° C., heat treatment in NH$_3$ atmosphere + heat treatment in O$_2$ atmosphere |
| Seventh sample (20) | | 700° C., heat treatment in N$_2$ atmosphere |
| Eighth sample (21) | | 500° C., heat treatment in O$_2$ atmosphere |
| Ninth sample (22) | | 600° C., heat treatment in O$_2$ atmosphere |

TABLE 1-continued

| sample | Dielectric layer | Post-treatment |
| --- | --- | --- |
| Tenth sample (23) | | O$_2$ plasma treatment |
| Eleventh sample (24) | Thermal SiO$_2$ | x |

In the samples of Table 1, ALD SiO$_2$ is formed using HCD as the silicon source gas and H$_2$O as oxidation gas. Here, pyridine (C$_5$H$_5$N) was employed as a catalyst to clearly show the carbon content change according to the post-treatment processing.

Referring to FIG. 6A, the samples 11, 12, 13 were subjected to a post-treatment heat treatment in O$_3$, N$_2$ and O$_2$ atmospheres respectively, and showed significant decreases in the chlorine content as compared with the sample 10 which was not subjected to a post-treatment. Even more dramatic were the results of samples 14 and 15, which were subjected to a post-treatment heat treatment in NH$_3$ atmospheres and showed remarkable decreases in the chlorine content.

Referring to FIG. 6B, samples 21 and 22 were subjected to a post-treatment heat treatment in an O$_2$ atmosphere, and sample 23 was subjected to an O$_2$ plasma treatment. These samples showed a higher carbon content than that of the thermal silicon dioxide layer 24, but were still lower in carbon content as compared with sample 20 which was subjected to a heat treatment in a N$_2$ atmosphere.

As the results of FIGS. 6A and 6B demonstrate, when a gate dielectric layer fabricated by the ALD method to have a laminated structure is subjected to a post-treatment according to embodiments of the present invention, the impurities such as carbon, chlorine, etc. remaining in the gate dielectric layer are effectively removed. Further, as described above, when the post-treatment is performed by the oxidation treatment, the nitridation treatment, the heat-treatment in a substantially inert gas atmosphere, the heat-treatment in a vacuum atmosphere, the heat-treatment in a hydrogen atmosphere, the plasma-treatment in a hydrogen atmosphere, or a combination thereof, the impurities may be effectively removed.

Hereinbelow, the properties of the hafnium silicate gate dielectric layer fabricated according to embodiments of the present invention are described.

In the following experimental examples, hafnium silicate gate dielectric layers were formed having a laminated structure wherein a hafnium oxide layer and a silicon oxide layer were alternately stacked on the semiconductor substrate. In one case, an HSHS sample was formed comprising a laminated structure of hafnium oxide layer/silicon oxide layer/hafnium oxide layer/silicon oxide layer. In a second case, an HSH sample was formed comprising a laminated structure of hafnium oxide layer/silicon oxide layer/hafnium oxide layer. Here, the respective hafnium oxide layers and the silicon oxide layers were formed by an ALD method. Further, each hafnium oxide layer was formed to have a thickness of about 10 Å, employing HfCl$_4$ as the hafnium source gas and H$_2$O as the oxidation gas. Also, each silicon oxide layer was formed to have a thickness of about 5 Å, employing HCD as the silicon source gas and H$_2$O as the oxidation gas. In addition, after forming each silicon oxide layer, NH$_3$ and O$_2$ heat treatments were performed at a temperature of 150° C. as post-treatment steps in accordance with this invention in order to remove impurities before forming the following hafnium oxide layer. Then, after a poly silicon layer was formed on each hafnium silicate gate dielectric layer, an impurity ion implantation process was performed on the two semiconductor devices, thereby fabricating an NMOS transistor and a PMOS transistor, which have gate dielectric layers of the HSHS and HSH samples, respectively.

For the purpose of comparison, comparison NMOS and PMOS transistors were fabricated, which employed a hafnium aluminate layer and a silicon oxynitride layer as the gate dielectric layers, respectively. Here, the hafnium aluminate layer was formed to have a laminated structure on which a hafnium oxide layer and a silicon oxide layer were alternately stacked. That is, an HAHA sample was formed having a laminated structure of hafnium oxide layer/aluminum oxide ($Al_2O_3$) layer/hafnium oxide layer/aluminum oxide layer, and an HAH sample was formed having a laminated structure of hafnium oxide layer/aluminum oxide layer/hafnium oxide layer on the semiconductor substrate, respectively. Here, the hafnium oxide layer and the aluminum oxide layer were each formed by the ALD method. Further, the hafnium oxide layer was formed to have a thickness of about 10 Å, employing $HfCl_4$ as the hafnium source gas and $H_2O$ as the oxidation gas. Also, the aluminum oxide layer was formed to have a thickness of about 5 Å, employing TMA (trimethylaluminum) as the aluminum source gas and $H_2O$ as the oxidation gas. Further, the silicon oxynitride layer was formed by a CVD method using silane ($SiH_4$) and $N_2O$ as the reaction gases.

Figure 7A:
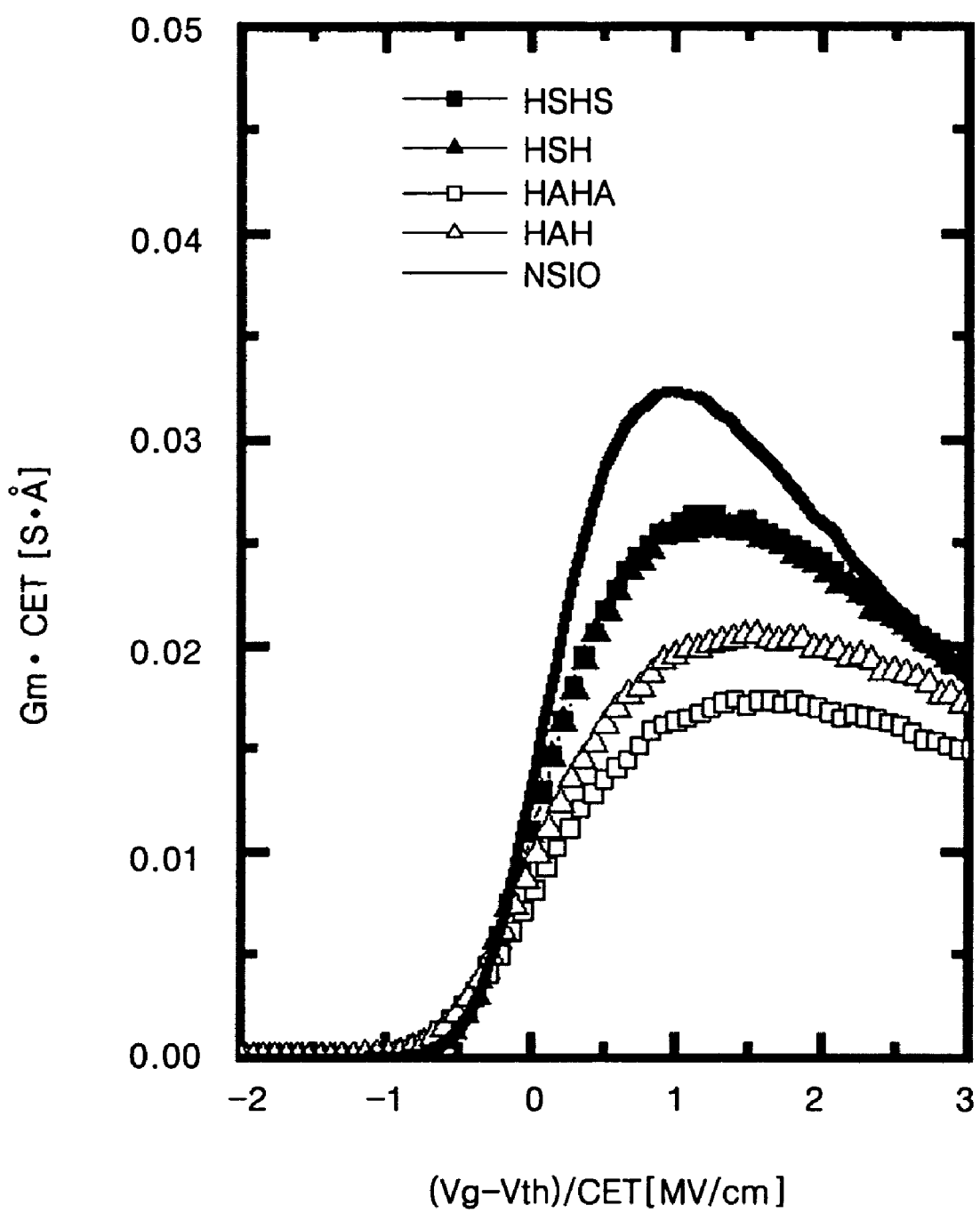
FIGS. 7A and 7B are graphs illustrating a change of mobility according to a gate dielectric layer in an NMOS transistor and a PMOS transistor, respectively.
Figure 7B:
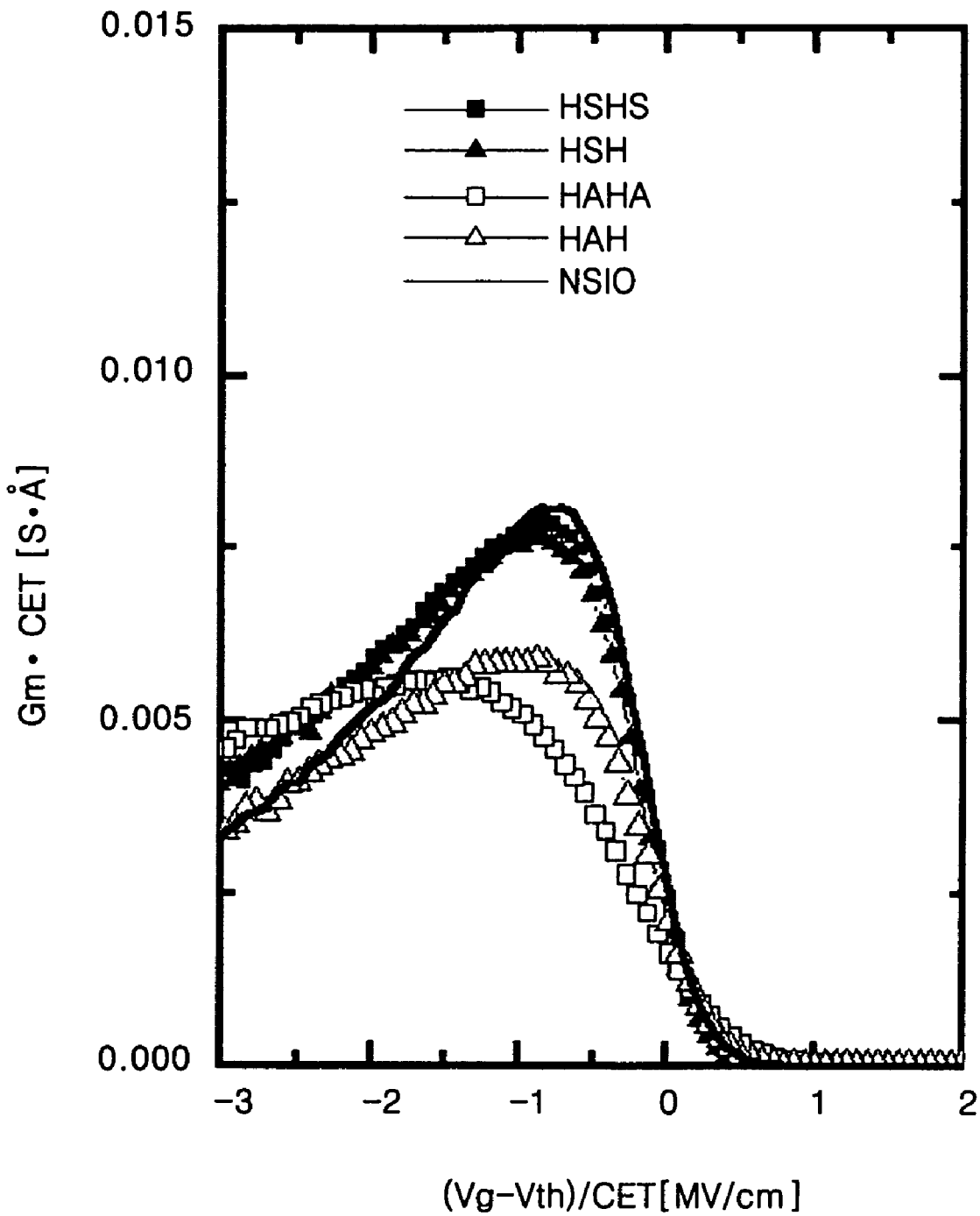

FIGS. 7A and 7B are graphs illustrating mobility according to gate dielectric layers in an NMOS transistor and a PMOS transistor, respectively. In FIGS. 7A and 7B, CET indicates the equivalent thickness of an oxide layer calculated from capacitance, Vg indicates a gate voltage, Vth indicates a threshold voltage, wherein the width W and the length L of each of the PMOS and NMOS transistors are 10 μm and 0.1 μm, respectively. Here, Gm (transconductance) was estimated in order to inspect the mobility, and Gm was illustrated with respect to an NSIO sample using a silicon nitride layer as the gate dielectric layer for the purpose of comparison.

Referring to FIGS. 7A and 7B, when the hafnium aluminate layer samples (HAHA, HAH) were employed as the gate dielectric layers, the NMOS and PMOS transistors had Gm values of 63% and 73% as compared with the NSIO sample, respectively. Alternatively, when the hafnium silicate layer samples (HSHS, HSH) were employed as the gate dielectric layers, the NMOS and PMOS transistors had Gm values of 80% and 95% as compared with the NSIO sample, respectively. That is, the gate dielectric layers employing the hafnium silicate layers processed by a post-treatment according to embodiments of the present invention demonstrated better mobility than the gate dielectric layers employing the hafnium aluminate layers.

Figure 8:
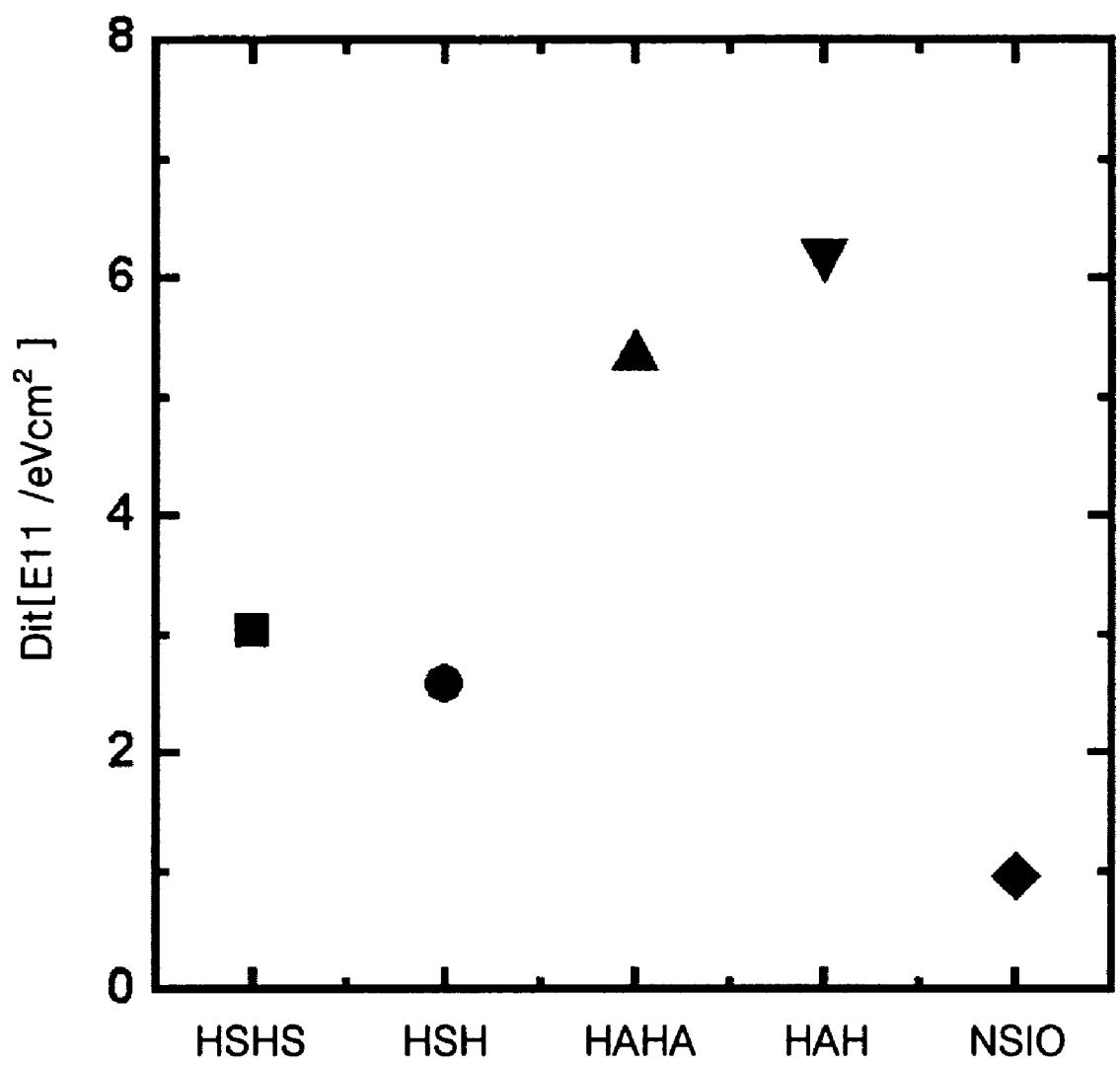
FIG. 8 is a graph illustrating interface state density according to a gate dielectric layer.

FIG. 8 is a graph illustrating interface state density (Dit) according to a gate dielectric layer. Here, the Dit properties of the gate dielectric layer were measured by a charge pumping method.

Referring to FIG. 8, the HSH laminated structure had a Dit value of $2.5E11/eVcm^2$, but the HAH laminated structure had a Dit value of $6.2E11/eVcm^2$. That is, the gate dielectric layer employing the hafnium silicate layer prepared in accordance with this invention demonstrated superior interfacial properties as compared with the gate dielectric layer employing the hafnium aluminate layer.

Figure 9A:
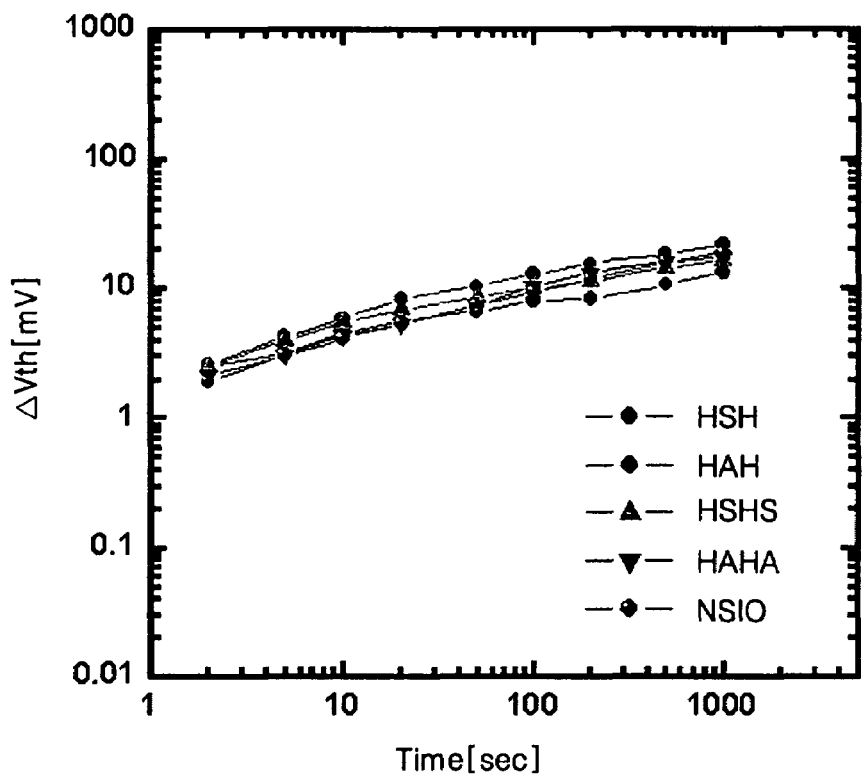
FIGS. 9A and 9B are graphs illustrating bias temperature instability (BTI) according to a gate dielectric layer in an NMOS transistor and a PMOS transistor, respectively.
Figure 9B:
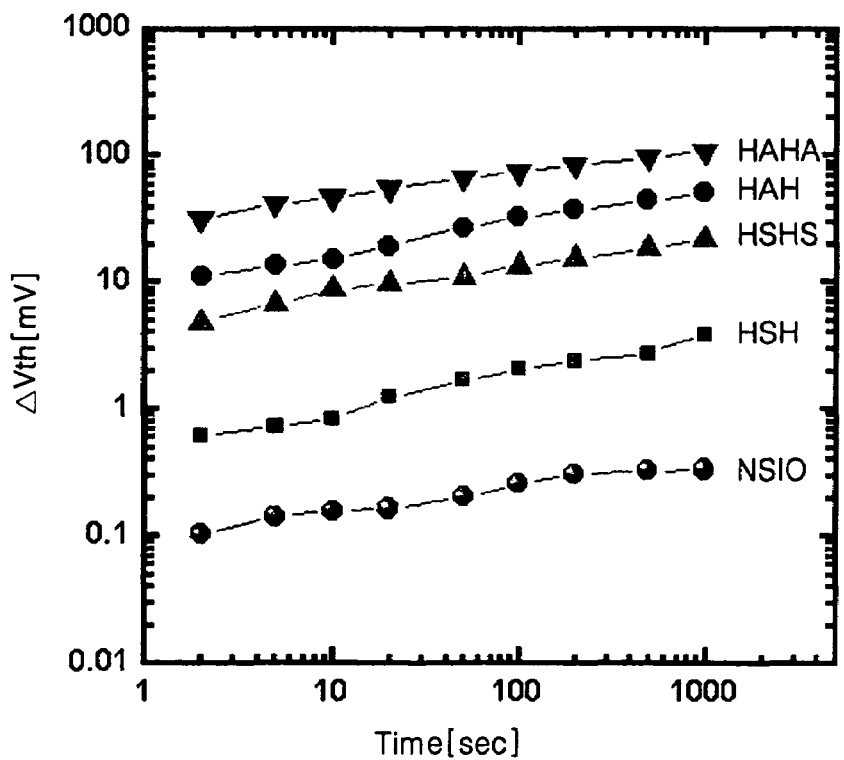

FIGS. 9A and 9B are graphs illustrating bias temperature instability (BTI) according to gate dielectric layers in an NMOS transistor and a PMOS transistor, respectively. FIGS. 9A and 9B illustrate a change of a threshold voltage with respect to time in the state where a thermal stress of 125° C. and an electric field of 10 MV/cm are applied to the gate dielectric layer.

Referring to FIGS. 9A and 9B, in the case of the PMOS transistor, the threshold voltage change of each of the HAHA, HAH, HSHS and HSH samples was approximately equal to that of the NSIO sample. On the other hand, in the case of the NMOS transistor, the threshold voltages of the HAHA and HAH samples were seriously changed. Oppositely, the threshold voltages of the HSHS and HSH samples prepared in accordance with this invention were only slightly changed relative to the HAHA and HAH samples. As a result, it is shown that the hafnium silicate layer has a charge trap site smaller than that of the hafnium aluminate layer.

As described above, according to the present invention, when the high-k dielectric layer is formed to have the laminated structure using the ALD method, the thickness and the composition of the dielectric layer are easily controlled.

Further, even though the metal dielectric layer is formed to have a critical thickness or more, the leakage current due to the partial crystallization of the metal dielectric layer during subsequent processing is prevented or at least substantially reduced.

Further, when the high-k dielectric layer having the laminated structure using the ALD method is processed by the post-treatment step according to this invention, the impurities in the dielectric layer may be minimized.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a high-k dielectric layer comprising the sequential steps of:

forming a stacked dielectric layer by forming a first dielectric layer of a first dielectric material on a semiconductor substrate using an atomic layer deposition (ALD) method; and thereafter forming a second dielectric layer of a second dielectric material on the first dielectric layer using an atomic layer deposition (ALD) method, wherein one of said first and second dielectric materials is a metal dielectric material and the other of said first and second dielectric materials is selected from the group consisting of silicon oxide and silicon oxynitride; and performing a post-treatment to the stacked dielectric layer;

further wherein the steps of forming the stacked dielectric layer and performing the post-treatment are repeated at least once to form a high-k dielectric layer comprising at least two of said stacked and post-treated dielectric layers.

2. The method as claimed in claim 1, further comprising the step of forming a third dielectric layer on the second dielectric layer after performing the post-treatment to the stacked dielectric layer, the third dielectric layer being formed of the same material as the first dielectric layer.

3. A method of fabricating a high-k dielectric layer comprising the sequential steps of:

forming a stacked dielectric layer by forming a first dielectric layer of a first dielectric material on a semiconductor substrate using an atomic layer deposition (ALD) method; and thereafter forming a second dielectric layer of a second dielectric material on the first dielectric layer using an atomic layer deposition (ALD) method; and performing a post-treatment to the stacked dielectric layer;

wherein the step of forming the stacked dielectric layer comprises the steps of:
forming a metal dielectric layer as the first dielectric layer on the semiconductor substrate; and
forming a silicon oxide layer or a silicon oxynitride layer as the second dielectric layer on the first dielectric layer;
and further wherein the steps of forming the stacked dielectric layer and performing the post-treatment are repeated at least once to form a high-k dielectric layer comprising at least two of said stacked and post-treated dielectric layers.

4. The method as claimed in claim 3, wherein the metal dielectric layer is formed of a material selected from the group consisting of a hafnium oxide layer, a hafnium oxynitride layer, a zirconium oxide layer and a zirconium oxynitride layer.

5. The method as claimed in claim 3, wherein the metal dielectric layer is formed of a hafnium oxide layer.

6. The method as claimed in claim 3, wherein the metal dielectric layer is formed to have a thickness of about 30 Å or less.

7. The method as claimed in claim 3, wherein the silicon oxide layer or the silicon oxynitride layer is formed to have a thickness of about 30 Å or less.

8. The method as claimed in claim 3, further comprising the step of forming a third dielectric layer on the second dielectric layer after performing the post-treatment to the stacked dielectric layer, the third dielectric layer being formed of the same material as the first dielectric layer.

9. The method as claimed in claim 3, wherein the post-treatment to the stacked dielectric layer is performed by a treatment step selected from the group consisting of an oxidation treatment, a nitridation treatment, a heat-treatment in a substantially inert atmosphere, a heat-treatment in a vacuum atmosphere, a heat-treatment in a hydrogen atmosphere, a plasma-treatment in a hydrogen atmosphere, and a combination of two or more of said treatment steps carried out simultaneously or in any suitable order.

10. The method as claimed in claim 9, wherein the post-treatment step comprises an oxidation treatment performed by a treatment step selected from the group consisting of a dry oxidation treatment in an NO, $NO_2$, or $O_3$ atmosphere, a plasma-treatment in an $O_2$ atmosphere, a heat treatment in an $O_3$ atmosphere, and a wet oxidation treatment in an $O_3$ atmosphere.

11. The method as claimed in claim 9, wherein the post-treatment step comprises a nitridation treatment performed by a treatment step selected from the group consisting of a nitrogen plasma treatment and a heat treatment in a nitrogen atmosphere.

12. The method as claimed in claim 3, further comprising the step of performing a post-treatment to the metal dielectric layer before forming the silicon oxide layer or the silicon oxynitride layer on the metal dielectric layer.

13. The method as claimed in claim 12, wherein the post-treatment to the metal dielectric layer is performed by a treatment step selected from the group consisting of an oxidation treatment, a nitridation treatment, a heat-treatment in a substantially inert atmosphere, a heat-treatment in a vacuum atmosphere, a heat-treatment in a hydrogen atmosphere, a plasma-treatment in a hydrogen atmosphere, and a combination of two or more of said treatment steps carried out simultaneously or in any suitable order.

14. A method of fabricating a high-k dielectric layer comprising the sequential steps of:
forming a stacked dielectric layer by forming a first dielectric layer of a first dielectric material on a semiconductor substrate using an atomic layer deposition (ALD) method; and thereafter forming a second dielectric layer of a second dielectric material on the first dielectric layer using an atomic layer deposition (ALD) method; and
performing a post-treatment to the stacked dielectric layer;
wherein the step of forming the stacked dielectric layer comprises the steps of:
forming a silicon oxide layer or a silicon oxynitride layer as the first dielectric layer on the semiconductor substrate; and
forming a metal dielectric layer as the second dielectric layer on the first dielectric layer;
and further wherein the steps of forming the stacked dielectric layer and performing the post-treatment are repeated at least once to form a high-k dielectric layer comprising at least two of said stacked and post-treated dielectric layers.

15. The method as claimed in claim 14, wherein the post-treatment to the stacked dielectric layer is performed by a treatment step selected from the group consisting of an oxidation treatment, a nitridation treatment, a heat-treatment in a substantially inert atmosphere, a heat-treatment in a vacuum atmosphere, a heat-treatment in a hydrogen atmosphere, a plasma-treatment in a hydrogen atmosphere, and a combination of two or more of said treatment steps carried out simultaneously or in any suitable order.

16. The method as claimed in claim 14, further comprising the step of performing a post-treatment to the silicon oxide layer or the silicon oxynitride layer before forming the metal dielectric layer on such silicon layer.

17. The method as claimed in claim 16, wherein the post-treatment to the silicon oxide layer or the silicon oxynitride layer is performed by a treatment step selected from the group consisting of an oxidation treatment, a nitridation treatment, a heat-treatment in a substantially inert atmosphere, a heat-treatment in a vacuum atmosphere, a heat-treatment in a hydrogen atmosphere, a plasma-treatment in a hydrogen atmosphere, and a combination of two or more of said treatment steps carried out simultaneously or in any suitable order.

18. A method of fabricating a gate dielectric layer comprising the sequential steps of:
forming a stacked dielectric layer by forming a first dielectric layer of a first dielectric material on a semiconductor substrate using an atomic layer deposition (ALD) method; and thereafter forming a second dielectric layer of a second dielectric material on the first dielectric layer using an ALD method, wherein one of said first and second dielectric materials is a metal dielectric material and the other of said first and second dielectric materials is selected from the group consisting of silicon oxide and silicon oxynitride; and
performing a post-treatment to the stacked dielectric layer;
further wherein the steps of forming the stacked dielectric layer and performing the post-treatment are repeated at least once to form a high-k dielectric layer comprising at least two of said stacked and post-treated dielectric layers.

19. A semiconductor device comprising a high-k dielectric layer or a gate dielectric layer prepared according to the method of claim 18.

20. An NMOS transistor device comprising a high-k dielectric layer or a gate dielectric layer prepared according to the method of claim 18.

21. A PMOS transistor device comprising a high-k dielectric layer or a gate dielectric layer prepared according to the method of claim 18.

22. A method of fabricating a gate dielectric layer comprising the sequential steps of:
- forming a stacked dielectric layer by forming a first dielectric layer of a first dielectric material on a semiconductor substrate using an atomic layer deposition (ALD) method; and thereafter forming a second dielectric layer of a second dielectric material on the first dielectric layer using an ALD method; and
- performing a post-treatment to the stacked dielectric layer;
- wherein the step of forming the stacked dielectric layer comprises the steps of:
- forming a metal dielectric layer as the first dielectric layer on the semiconductor substrate; and
- forming a silicon oxide layer or a silicon oxynitride layer as the second dielectric layer on the first dielectric layer;
- and further wherein the steps of forming the stacked dielectric layer and performing the post-treatment are repeated at least once to form a high-k dielectric layer comprising at least two of said stacked and post-treated dielectric layers.

23. The method as claimed in claim 22, wherein the metal dielectric layer is formed of a hafnium oxide layer.

24. The method as claimed in claim 22, wherein the metal dielectric layer is formed to have a thickness of about 30 Å or less.

25. The method as claimed in claim 22, wherein the silicon oxide layer or the silicon oxynitride layer is formed to have a thickness of about 30 Å or less.

26. The method as claimed in claim 22, wherein the post-treatment to the stacked dielectric layer is performed by a treatment step selected from the group consisting of an oxidation treatment, a nitridation treatment, a heat-treatment in a substantially inert atmosphere, a heat-treatment in a vacuum atmosphere, a heat-treatment in a hydrogen atmosphere, a plasma-treatment in a hydrogen atmosphere, and a combination of two or more of said treatment steps carried out simultaneously or in any suitable order.

27. The method as claimed in claim 22, further comprising the step of performing a post-treatment to the metal dielectric layer before forming the silicon oxide layer or the silicon oxynitride layer on the metal dielectric layer.

28. The method as claimed in claim 27, wherein the post-treatment to the metal dielectric layer is performed by a treatment step selected from the group consisting of an oxidation treatment, a nitridation treatment, a heat-treatment in a substantially inert atmosphere, a heat-treatment in a vacuum atmosphere, a heat-treatment in a hydrogen atmosphere, a plasma-treatment in a hydrogen atmosphere, and a combination of two or more of said treatment steps carried out simultaneously or in any suitable order.

29. A method of fabricating a gate dielectric layer comprising the sequential steps of:
- forming a stacked dielectric layer by forming a first dielectric layer of a first dielectric material on a semiconductor substrate using an atomic layer deposition (ALD) method; and thereafter forming a second dielectric layer of a second dielectric material on the first dielectric layer using an ALD method; and
- performing a post-treatment to the stacked dielectric layer;
- wherein the step of forming the stacked dielectric layer comprises the steps of:
- forming a silicon oxide layer or a silicon oxynitride layer as the first dielectric layer on the semiconductor substrate; and
- forming a metal dielectric layer as the second dielectric layer on the first dielectric layer;
- and further wherein the steps of forming the stacked dielectric layer and performing the post-treatment are repeated at least once to form a high-k dielectric layer comprising at least two of said stacked and post-treated dielectric layers.

30. The method as claimed in claim 29, wherein the post-treatment to the stacked dielectric layer is performed by a treatment step selected from the group consisting of an oxidation treatment, a nitridation treatment, a heat-treatment in a substantially inert atmosphere, a heat-treatment in a vacuum atmosphere, a heat-treatment in a hydrogen atmosphere, a plasma-treatment in a hydrogen atmosphere, and a combination of two or more of said treatment steps carried out simultaneously or in any suitable order.

31. The method as claimed in claim 29, further comprising the step of performing a post-treatment to the silicon oxide layer or the silicon oxynitride layer before forming the metal dielectric layer on such silicon layer.

32. The method as claimed in claim 31, wherein the post-treatment to the silicon oxide layer or the silicon oxynitride layer is performed by a treatment step selected from the group consisting of an oxidation treatment, a nitridation treatment, a heat-treatment in a substantially inert atmosphere, a heat-treatment in a vacuum atmosphere, a heat-treatment in a hydrogen atmosphere, a plasma-treatment in a hydrogen atmosphere, and a combination of two or more of said treatment steps carried out simultaneously or in any suitable order.

* * * * *